United States Patent [19]

Amir

[11] Patent Number: 4,965,665
[45] Date of Patent: Oct. 23, 1990

[54] 3D IMAGING OF A SUBSTRATE USING PERPENDICULAR SCANNING DIRECTIONS

[75] Inventor: Israel Amir, Ewing, N.J.

[73] Assignee: AT&T Bell Laboratories, Murray Hill, N.J.

[21] Appl. No.: 426,366

[22] Filed: Oct. 25, 1989

[51] Int. Cl.$^5$ .............................................. H04N 7/18
[52] U.S. Cl. .................................. 358/101; 358/107; 358/88; 358/106; 356/373; 382/8
[58] Field of Search ................. 358/101, 106, 107, 89, 358/88; 250/563; 356/373, 375, 376, 378, 379, 380, 381; 382/8

[56] References Cited

U.S. PATENT DOCUMENTS

| | | | |
|---|---|---|---|
| 4,113,389 | 9/1978 | Kaye | 356/373 |
| 4,647,208 | 3/1937 | Bieman | 358/101 X |
| 4,677,473 | 6/1987 | Okamoto et al. | 358/101 |
| 4,731,853 | 3/1988 | Hata et al. | 358/101 X |
| 4,767,212 | 8/1988 | Kitahashi et al. | 356/379 |
| 4,811,410 | 3/1989 | Amir et al. | 382/8 |
| 4,849,645 | 7/1989 | Mendenko et al. | 250/563 |

*Primary Examiner*—Victor R. Kostak
*Attorney, Agent, or Firm*—Robert B. Levy

[57] ABSTRACT

A system (10) for obtaining a three-dimensional image of a substrate (12) comprises a linescan camera (20) trained on the substrate normal to the plane of its surface to capture the image of a strip of area ($S_y$) running along a first axis. A reflective member (38), driven by a motor (39), spans a line of light (36) generated by a laser (30) at an angle across the surface of the substrate so each of a plurality of strips of area ($S_a, S_b, S_c \ldots$), including the strip ($S_y$) imaged by the camera, is successively illuminated. A processing device (26) is coupled both to the camera (20) and to the motor (39) to synchronize them so that the camera captures the image of the strip within its field of view each time a successive one of the strips ($S_a, S_b, S_c \ldots S_y$) is illuminated. The processing device (26) further serves to process the successively captured images of the strip ($S_y$) within the field of view of the camera to obtain a three-dimensional image of the strip. A relative motion is imparted between the linescan camera (20) and the substrate (12) by a slide to enable a three-dimensional image of the substrate to be obtained.

9 Claims, 4 Drawing Sheets

3D IMAGING OF A SUBSTRATE USING PERPENDICULAR SCANNING DIRECTIONS

TECHNICAL FIELD

This invention relates to a method and apparatus for capturing a three-dimensional image of a substrate.

BACKGROUND OF THE INVENTION

Within the electronics industry, there is a trend towards automated inspection of circuit boards to detect defects such as missing or misplaced components. By detecting such defects at an early stage of manufacture, preferably prior to soldering of the components to the circuit board, repairs can be performed much more economically. Such "pre-solder" inspection also facilitates better control of circuit board manufacturing.

In U.S. Pat. No. 4,811,410 issued on Mar. 7, 1989 in the name of I. Amir et al. and assigned to AT&T, there is disclosed a technique for inspecting a circuit board by directing a beam of light towards the board at a first angle. The intensity of the light reflected at a second angle from the circuit board is sensed by a linescan-type camera. This type of camera is characterized by a plurality of light-sensing elements arranged in a linear array so that the each element of the camera senses the light intensity from a small region within a thin strip of surface area running across the board surface so as to capture the image of the region. A relative motion is imparted between the circuit board and linescan camera so the camera captures the image of successive strips of area on the circuit board. The output signal of the linescan camera is then processed to retain only the image of those regions of interest in each strip. The images of the regions of interest are then subsequently processed to detect if defects, such as missing and misplaced components, are present.

The linescan inspection system disclosed in the Amir et al. patent (incorporated by reference herein) has proven useful for pre-solder inspection of circuit boards containing through-hole components (i.e., components with leads designed for insertion through openings in the board). The Amir et al. system, especially when operated in the manner taught in co-pending application, Ser. No. 316,004, filed on Feb. 27, 1989, in the name of I. Amir et al. and assigned to AT&T (herein incorporated by reference), has also proven useful for inspecting circuit boards containing surface mount components. Surface mount components differ from their through-hole counterparts in that surface mount components have conductive members (i.e., leads or pads) designed for solder bonding to metallized areas on the surface of the circuit board. Unlike through-hole components, which are commonly wave soldered to the circuit board, surface mount components are solder bonded to the board by a different process. First, solder paste is applied to the metallized areas on the circuit board and then, the conductive members of each component are placed on the paste-coated areas. After component placement, the solder paste is reflowed to bond the conductive members of the component to the circuit board.

While the Amir et al. linescan inspection system can accomplish presolder inspection of circuit boards containing surface mount components, the results are usually less accurate than with circuit boards carrying through-hole components. One reason is that the solder paste applied to the metallized areas on the circuit board tends to be reflective, although much less so than the leads on a leaded surface mount component. In the absence of a component lead, the solder paste thus reflects light into the linescan camera, causing the linescan camera to possibly mistake the paste for a component lead. The ability to distinguish between solder paste-coated metallized areas and the component leads could be enhanced if the presence and nominal position of the components were known, such as by having a three-dimensional image of the circuit board. Further, the ability to obtain a three-dimensional image of the circuit board would also greatly facilitate inspection of the circuit board after application of the solder paste (but before component placement) and after soldering. However, there is no known system which affords three-dimensional imaging using a linescan camera.

Thus, there is need for a technique for accomplishing three-dimensional imaging of a substrate, such as a circuit board, with a linescan camera.

SUMMARY OF THE INVENTION

Briefly, in accordance with the invention, three-dimensional imaging of a substrate is achieved by training a linescan camera normal to the plane of the substrate surface so that camera acquires the image of a thin strip of area running across the surface along a first axis. A line of light, parallel to the first axis, is spanned across the substrate surface at an angle thereto along a second axis perpendicular to the first axis, to successively illuminate each of a plurality of strips of area, including the strip imaged by the linescan camera. The linescan camera successively captures the image of the strip within its field of view simultaneously with the illumination of a successive one of the strips of area spanned by the line of light. The successive images captured by the linescan camera of the strip within its field of view are processed to determine the vertical position of any attributes (i.e., objects or depressions) appearing in the strip. A relative motion is imparted between the camera and the substrate to obtain a three-dimensional image of the substrate.

DETAILED DESCRIPTION

Figure 1:
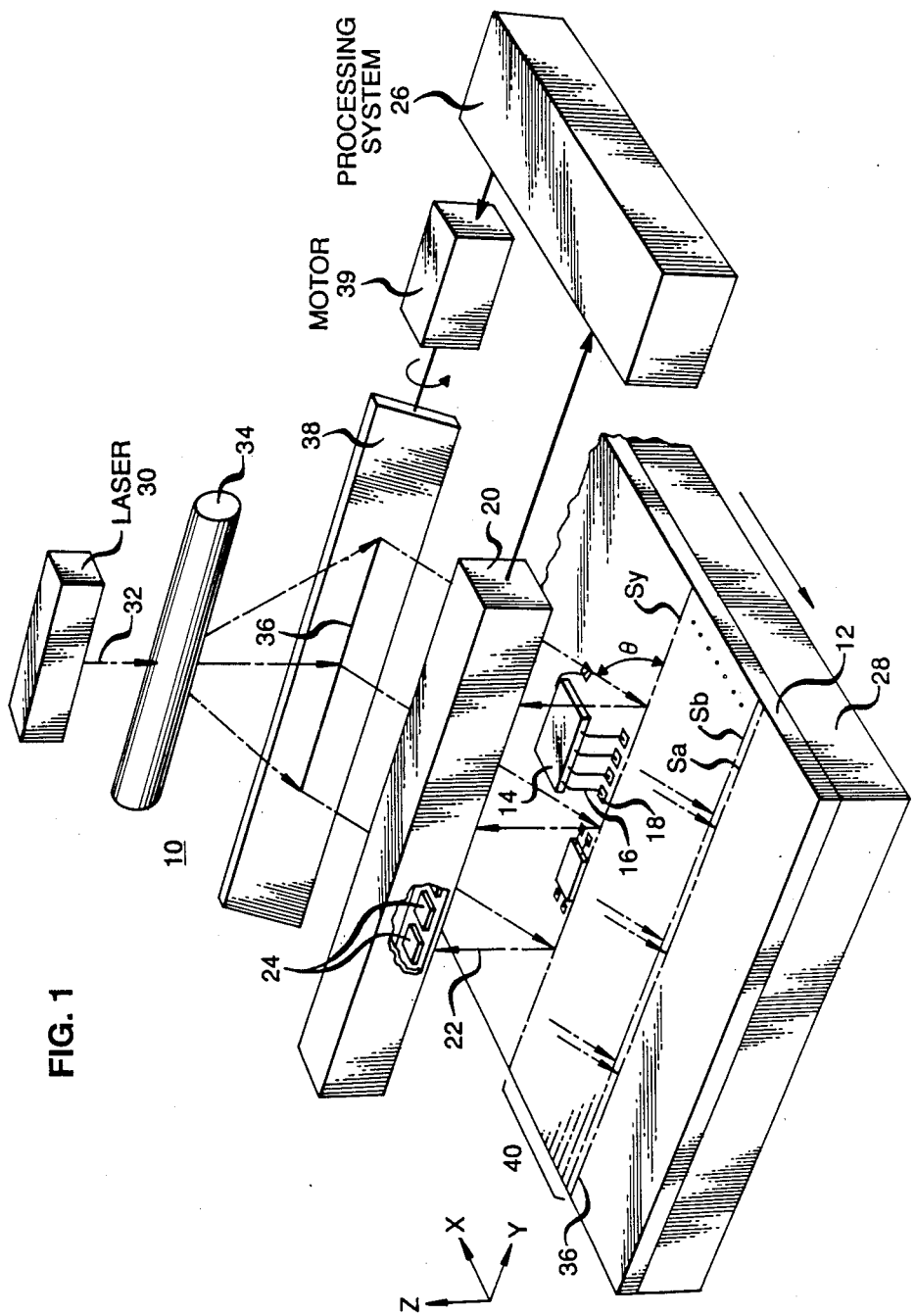
FIG. 1 is a perspective view of a system, in accordance with a preferred embodiment of the invention, for obtaining a three-dimensional image of a substrate.

FIG. 1 illustrates a system 10, in accordance a preferred embodiment of the invention, for establishing a three-dimensional image of a substrate 12. In the illustrated embodiment, the substrate 12 comprises a circuit board which carries a plurality of components 14, at least one of which has a set of conductive members (i.e., leads) 16 seated on solder paste-coated metallized areas 18 on the surface of the board.

The system 10 comprises an image-acquisition device 20 in the form of a linescan camera which is trained on the circuit board 12 so that the camera has its optical axes 22 substantially normal to the plane of the surface of the board. The linescan camera 20 is of a well-known type and comprises a plurality of (typically 4096) individual light-sensing elements 24 (i.e., charge-coupled devices) arranged in a linear array parallel the y axis of the circuit board 12. Each light-sensing element 24 senses the intensity (gray level) of the light reflected from a small square or rectangular region within a thin strip of area $s_y$ running across the surface of the board parallel to the y axis so as to capture the image of this region. The small region imaged by each light-sensing element 24 corresponds to a small picture element (pixel) within the image of the strip captured by the camera 20.

The size of each pixel imaged by each light-sensing element 24 depends on the optics (not shown) of the camera 20. Preferably, the optics of the camera 20 are selected such that the pixel imaged by each light-sensing element 24 is about 0.003 inches (75 microns) wide (as measured along the x axis) and the collective length of the pixels equals the width of the circuit board 12 lying along the y axis.

Figure 4:
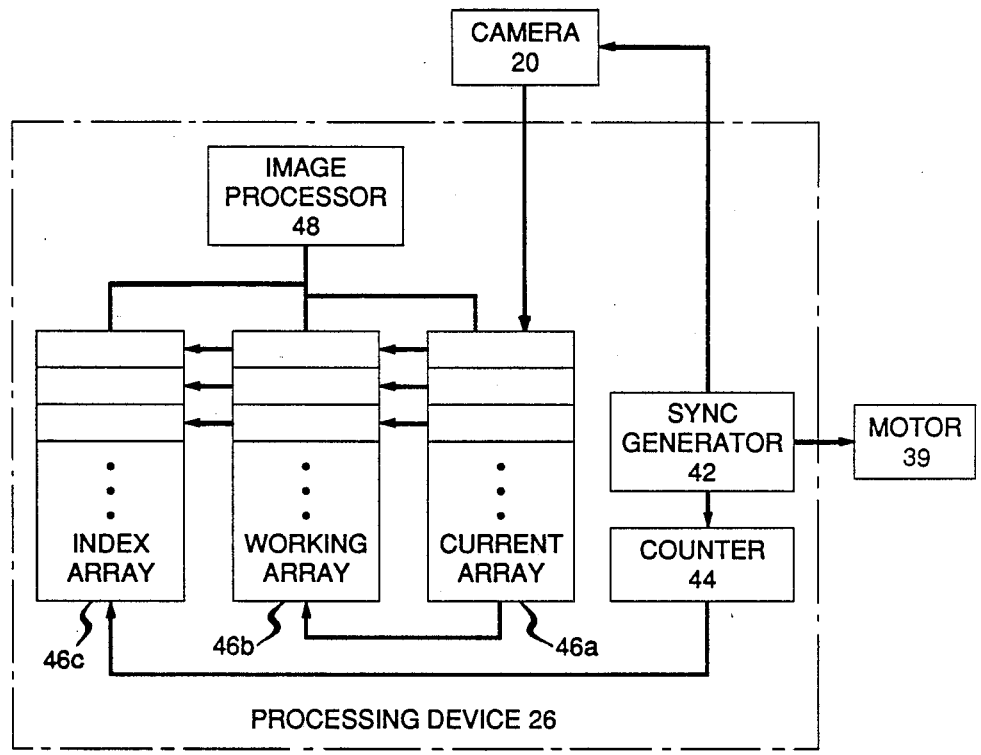
FIG. 4 is a block schematic diagram of a processing device embodied within the system of FIG. 1.

The output signal of the camera 20 (the collective output signal of the individual light-sensing elements 24) is input to a processing device 26 described further with respect to FIG. 4. As will be described, the processing device 26 successively obtains the value of the light intensity sensed by each of the light-sensing elements 24 so as to capture the entire image of the strip $s_y$. To obtain the image of successive strips of area on the circuit board 12, a relative motion is imparted between the camera 20 and the circuit board. To that end, the circuit board 28 is supported by a slide 28 which is stepped or moved along the x axis under the control of a slide control (not shown). The speed at which the slide 28 moves is selected to be much slower than the rate at which the processing system 26 acquires the image of the strip $s_y$.

The imaging system 10 also includes a laser 30 whose beam is directed into a cylindrical focusing element 34. The focusing element 34 focuses the beam 32 into a line of light 36 which is parallel to the linear array of elements 24 in the camera 20. The line of light 36 is directed onto a reflective member 38 which reflects the line onto the circuit board 12 at an acute angle $\theta$, so that the line of light extends across the surface of the board parallel to the y axis. The width or thickness of the line of light 36 depends on the diameter of the beam 32 of the laser 30. In practice, the diameter of the beam 30, and hence the width of the line of light 36, is chosen to be 3 mils (75 microns), the same width as the strip of area $s_y$ imaged by the camera 20.

The reflective member 38 is rotatably driven about an axis parallel to the y axis by a motor 39, under control of the processing device 26, to displace or span the line of light 36 across the surface on the circuit board 12 along the x axis. In this way, the line of light 36 successively illuminates each of a plurality of thin, contiguous strips of area on the circuit board 12 lying in a band 40. The number of contiguous strips in the band 40 depends on the arc through which the reflective member 38 is rotated by the motor 39. For example, the reflective member 38 is rotated through an arc sufficient to cause the line of light 36 to successively illuminate twenty-five strips $s_a, s_b, s_c \ldots s_y$, including the strip imaged by the camera 20, although more or less strips could lie in the band 40 if desired.

Figure 2:
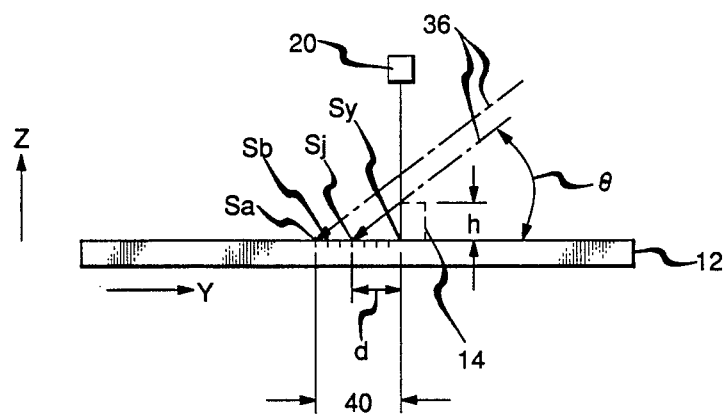
FIG. 2 is a side view of the substrate of FIG. 1 showing the manner in which the system of FIG. 1 detects the height of an object on the substrate.

Successive illumination of the strips $s_a, s_b, s_c \ldots s_y$ within the band 40 enables the height of a component 14 (or portion thereof) lying within the band to be established. To understand how the height of the component 14 may be established by successive illumination of the strips $s_a, s_b, s_c \ldots s_y$, reference should be had to FIG. 2 which is a side view of the circuit board 12 of FIG. 1. As each of the strips $s_a, s_b, s_c \ldots s_y$ is successively illuminated, the camera 20 is synchronized to capture the image of the strip $s_y$ in its field of view. When no component 14, nor any part thereof, lies within the band 40, the strip $s_y$ imaged by the camera 22 appears bright only when the line of light 36 spans the strip. In practice there may be some spurious reflection of light into the camera 20, but for purposes of explanation, its effect will be ignored.

Now consider what happens when all or part of a component 14 lies within the band 40. To simplify the discussion, assume that the forward (left-hand) end of the component 14 appears within the strip $s_y$ in the band 40. As the line of light 36 is successively directed at each of the strips $s_a, s_b, s_c \ldots s_y$, the strip $s_y$ imaged by the camera 20 appears dark until the line of light hits the top of the component 14 and is thereby reflected into the camera 20. Whether the camera 20 will observe the image of the strip $s_y$ as being bright when the line of light 36 is directed at a particular one of the strips $s_a, s_b, s_c \ldots s_y$ depends on the height h of the component 14. If the component 14 is relatively tall, then the camera 20 will observe the strip $s_y$ as being bright when the line of light 36 is directed at one of the strips ($s_a, s_b, s_c \ldots$) located in the left-hand portion of the band 40 of FIG. 2. Conversely, when the component 14 is short, the strip $s_y$ appears bright to the camera 20 when the line of light 36 is directed at one of the strips ($\ldots s_v, s_w, s_x$) near the right-hand end of the band 40.

As indicated, the camera 20 is synchronized to capture the image of the strip $s_y$ each time the line of light is directed at a successive one of the strips $s_a, s_b, s_c \ldots s_y$ in the band 40. By knowing that the camera 20 observes a bright image when the line of light 36 is directed at a particular one of the strips $s_a, s_b, s_c \ldots s_y$, the height of the component 14 can be established by triangulation. For example, assume that the camera 20 sees the strip $s_y$ as being bright when the beam of light is directed at strip $s_j$. By knowing how many strips lie between the strips $s_j$ and $s_y$, and by knowing the width of each strip, the lateral distance d between the strips $s_j$ and $s_y$ can be established. From a knowledge of the lateral distance d between the strips $s_j$ and $s_y$, and from a knowledge of the angle $\theta$ at which the line of light 36 impinges the surface of the circuit board 12, the height (h) of the component 14 lying within the strip $s_y$ will be given by:

$$h = \tan\theta \cdot d$$

The maximum height h (distance along the +z axis) that can be measured depends on the number of strips in the band 40, and the angle $\theta$. Increasing the magnitude of both parameters will increase the height measurement range, but at a cost of reduced accuracy.

Figure 3:
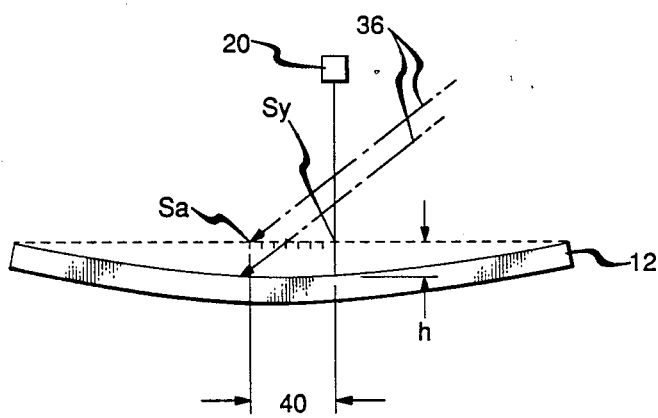
FIG. 3 is a side view of the substrate of FIG. 1 showing the manner in which the system of FIG. 1 detects warpage (depression) of the substrate.

Not only can the distance along the +z axis be measured, but distances along the −z axis (depressions in the level of the circuit board 12) can also be measured. This may be better understood by reference to FIG. 3 which shows the circuit board 12 in a warped condition such that most of the area on the upper surface of the board lies below the origin of the z axis. When the line of light 36 is spanned across the circuit board 12 in the manner described previously, even in the absence of a component 14, the image of the strip $s_y$ will not appear bright when the line of light is directed at this strip. Since much of the surface of the circuit board 12 is warped and lies below the origin of the z axis, the line of light 36, when directed at the strip $s_y$, will actually illuminate a strip to the left of it.

The lateral distance d between where the line of light 36 actually impinges the surface of the circuit board 12 and positions the strip $s_y$ can be related to the distance −h between the origin of the z axis and the surface of the board using equation (1). Thus, the distance −h may be established by triangulation in the same manner described above. However, to compute the distance −h, the line of light 36 must be spanned across the surface of the circuit board 12 such that the last strip of area at which the line of light is directed lies to the right of the strip $s_y$ in FIG. 3. The distance between the right-hand most strip of area on the surface of the board 12 spanned by the line of light 36 and the strip $s_y$ imaged by the camera 20 determines the maximum value of −h that can be measured.

The technique described above allows the height (or depth) of an attribute (object or depression) lying within the strip $s_y$ on the circuit board 12 to be measured. By displacing the circuit board 12 relative to the camera 20 along the x axis so that the camera images successive strips of area on the board, a three-dimensional image can be established. From such a three-dimensional image, the presence and nominal position of each of the components 14 can be established.

Referring now to FIG. 4, there is shown a block schematic diagram of the processing device 26 which controls the operation of the system 10 of FIG. 1. The processing device 26 includes a synchronization (sync) generator 42 that generates a periodic signal which is supplied to the motor 39 and to the camera 20. The period signal from the sync generator 42 synchronizes the motor 39 to the camera 20 of FIG. 1 by causing the camera to capture the image of the strip $s_y$ at the same time the motor steps or rotates the reflective member 38 of FIG. 1 through a small arc segment to span the line of light 36 of FIG. 1 across the next successive strip.

The output signal of the sync generator 42 is also supplied to a counter 44 which counts the number of sync signal alternations, thereby identifying which of the successive strips $s_a$, $s_b$ ... $s_y$ on the surface of the circuit board 12 of FIG. 1 is being illuminated. The count of the counter 44 of FIG. 4 serves as a clock signal for each of a set of memory arrays 46a, 46b, and 46c. Each of the memory arrays 46a, 46b and 46c contains n storage locations, where n is the number of light-sensing elements 24 (see FIG. 1) in the camera 20.

The memory array 46a is designated as the "current array" because it stores each successive set of intensity values sensed by each of the light-sensing elements 24 in the linescan camera 20 each time the camera captures the image of the strip $s_y$. The array 46b is referred to as the "working array" because it stores a set of "working" pixel intensity values which represent the highest pixel intensity values sensed thus far. As will be described in greater detail hereinafter, the working array 46b is coupled to the current array 46a and receives selected pixel intensity value data therefrom. The memory array 46c is designated as the "index array" because it stores a set of index values, each serving to reference a separate one of the pixel intensity values in the array 46b to the particular one $s_a$, $s_b$ ... $s_y$ which was illuminated when the pixel intensity value was obtained.

Figure 5:
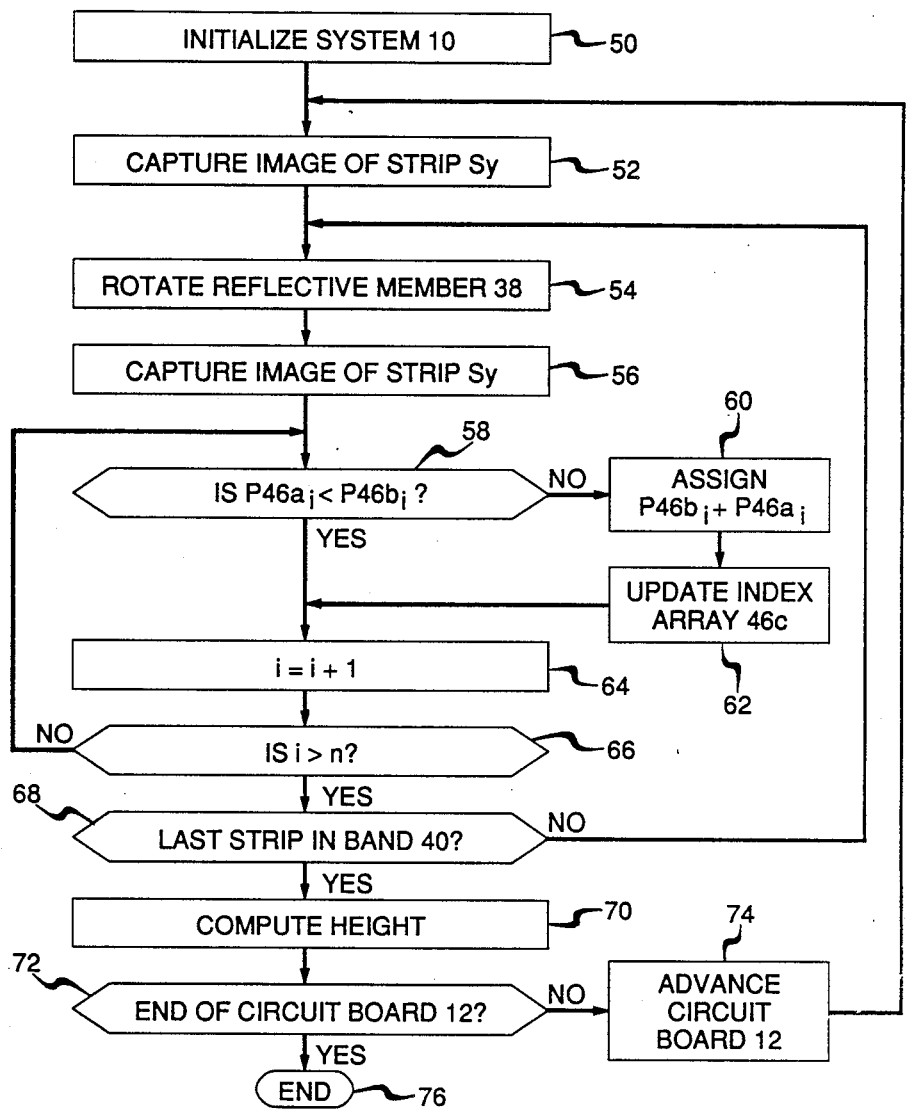
FIG. 5 is a flow chart diagram of the steps executed by the system of FIG. 1 to obtain a three-dimensional image of the substrate.

Each of the arrays 46a, 46b and 46c is coupled to an image processor 48, which typically takes the form of a microcomputer or the like. The image processor 48 is programmed to selectively transfer data from the current array 46a to the working array 46b and to simultaneously update the index array 46c in the manner shown in FIG. 5. Referring to FIG. 5, there is shown a flow chart representation of the steps performed to establish a three-dimensional image of the circuit board 12 of FIG. 1. First, step 50 is executed and the system 10 is initialized by positioning the reflective member 38 so the first strip ($s_a$) of area spanned by the line of light 36 lies at the forward (left-hand edge) of the circuit board 12. At the same time, the slide 28 is displaced to its right-hand position (see FIG. 1) so that the circuit board 12 may be fully displaced past the linescan camera 20 along the x axis. With the circuit board 12 so positioned, the strip $s_y$ imaged by the camera 20 will lie a short distance (75 mils or 1.875 mm) inside the edge of the board.

Following step 50, step 52 is executed, at which time the light-sensing elements 24 (see FIG. 1) within the camera 20 (both of FIG. 1) each generate a pixel intensity value, representing the intensity of light reflected from a separate one of the small regions lying in the strip $s_y$ while the strip $s_a$ is spanned by the line of light 36. The pixel intensity value produced by each of the n light-sensing elements 24 is stored in a separate one of the n storage locations in the working array 46b. The term $P46b_i$ (where i=1,2 ... n) will be used hereinafter to identify each of the pixel intensity values stored in the array 46b. At the same time the array 46b is receiving each of the pixel intensity values $P46b_i$, the count of the counter 44, which designates the strip spanned by the line of light 36, is stored in each of the n locations in the index array 46c.

Step 54 is executed next and the reflective member 38 of FIG. 1 is rotated through a predetermined arc segment, in response to a sync signal supplied to the motor 40 of FIG. 1, to cause the line of light 36 of FIG. 1 to span the next successive strip in the band 40. Step 56 is then executed, during which the image of the strip $s_y$ in the field of view of the camera 20 is again captured. However, the pixel intensity value sensed by each of the n light-sensing elements 24 of FIG. 1 is now stored in a separate one of the n locations of the current array 46a rather than the working array 46b. Each of the pixel intensity values stored in the array 46a is represented by the term $P46a_i$ where i=1,2 ... n. Next, step 58 is executed and a comparison is made between the $i^{th}$ the pixel intensity value $P46b_i$ in the working array 46b and the $i^{th}$ pixel intensity value $P46a_i$ in the current array 46a. During the initialization of the system 10 of FIG. 1, the value of i is set equal to unity. Thus, upon the initial execution of step 58, the pixel intensity value $P46b_1$ in the working array 46b is compared to the pixel intensity value $P46a_1$ stored in the current array 46a.

If, upon the execution of step 58, $P46a_i > P46b_i$, then step 60 is executed and the current value of $P46b_i$ is replaced with the value of $P46a_i$. Following step 60, step 62 is executed and the current count of the counter, which represents the identity of the current one of the strips $s_a$, $s_b$, $s_c$ ... $s_y$ spanned by the beam of light 36 of FIG. 1, is stored in the $i^{th}$ location of the index array 46c. By comparing P46$a_i$ to P46$b_i$, a determination can be made as to whether the $i^{th}$ pixel intensity value in the just-captured image of the strip $s_y$ is greater or smaller than the highest previously found corresponding pixel intensity value. Should the current pixel intensity value (P46$a_i$) be greater, then this value is stored in the working array 46b in place of the value P46$b_i$. Each time the pixel intensity value P46$b_i$ is assigned the value of P46$a_i$, then the index array 46c is updated to reflect the identity of the particular strip, which, when spanned by the line of light 36 of FIG. 1, yielded the highest pixel intensity value so far. The comparison and substitution of pixel intensity values in this fashion enables the identity of the particular strip, which, when spanned, yielded the brightest image. Further, this approach helps to reduce the influence of spurious light being reflected into the linescan camera 20 which might otherwise adversely influence the resultant three-dimensional image that is obtained.

Following step 62, or following step 58 when P446$a_i$ was found to be less that P46$b_i$, then the step 64 is executed and the value of i is incremented by unity. Thereafter a check is made during step 66 to determine if i equals n, the number of stored pixel intensity values in each of the arrays 46a and 46b. If i<n, then step 58, and those following it, are repeated. Otherwise, when i>n, then a check is made during step 68 to determine whether the strip presently spanned by the line of light 36 is the last one in the band 40 of FIG. 1. If there are additional strips to be spanned, then step 54, and those following it, are re-executed. Otherwise, step 70 is executed and the height of each attribute (such as a component 14) appearing within the strip $s_y$ is computed using eq. (1). As discussed previously, the depth of any depressions (not shown) can also be computed.

Once the height or depth has been computed during step 70, a check is made during step 72 to determine whether the slide 28 and, hence, the circuit board 12 have reached the end of their travel. If the circuit board 12 has not reached the end of its travel, then the slide 28 is incrementally advanced during step 74 to incrementally advance the circuit board 12. Following step 74, step 52, and those following it, are re-executed. Otherwise, when the slide 28 and hence the circuit board 12 have reached the end of their travel, then step 76 is executed, and the process ends. After completion of the process, the height information obtained for each successive strip imaged by the camera 20 can be plotted to provide a three-dimensional image of the circuit board 12.

The foregoing describes a technique for establishing a three-dimensional image of a substrate, such as a circuit board 12, by successively spanning the board with a line of light directed at an angle thereto while simultaneously capturing successive images of a strip running across the board with a linescan camera 20.

It is to be understood that the above-described embodiments are merely illustrative of the principles of the invention. Various modifications and changes may be made thereto by those skilled in the art which will embody the principles of the invention and fall within the spirit and scope thereof.

I claim:

1. A method for obtaining a three-dimensional image of a substrate comprising the steps of:
   (a) training a linescan camera onto the surface of a substrate normal to its plane so that a strip of area, running across the surface of the substrate parallel to a first axis, is within the field of view of the camera so the camera may capture the image thereof;
   (b) spanning the substrate, along a second axis perpendicular to the first axis, with a line of light parallel to the first axis, the line of light being directed at the surface of the substrate at an angle to successively illuminate each of a plurality of contiguous strips of area, including the strip within the field of view of the linescan camera;
   (c) simultaneously capturing the image of the strip within the field of view of the camera each time a successive one of the plurality of strips is illuminated by the line of light;
   (d) processing the successive images captured by the linescan camera to establish a three-dimensional image of the strip within its field of view; and
   (e) imparting a relative motion between the linescan camera and the substrate along the second axis to obtain a three-dimensional image of the substrate.

2. The method according to claim 1 wherein the spanning step comprises the steps of:
   (a) directing a beam of light into a circular focusing means to produce a line of light focused on a reflective member;
   (b) positioning the reflective member to direct the line of light onto the surface of the substrate; and
   (c) rotating the reflective member with a motor to span the line of light across the surface of the substrate.

3. The method according to claim 2 wherein the motor driving the reflective member is stepped at the same time the linescan camera is rendered operative to capture the image of the strip in its field of view.

4. The method according to claim 1 wherein the step of processing the successive images obtained by the linescan camera comprises the steps of:
   (a) establishing the intensity of the light reflected from each of a separate one of a plurality of regions within the strip lying within the field of view of the linescan camera each time the camera successively captures the image of the strip;
   (b) storing each of the intensity values, obtained upon initial capture of the image of the strip, in a separate one of a plurality of separate storage locations and according each initial intensity value a predetermined index;
   (c) comparing each of the stored intensity values to the next successively established intensity value for the corresponding region in the strip in the field of view of the camera;
   (d) replacing each stored intensity value with the next successively established intensity value for the corresponding region in the strip and adjusting the index associated with the stored value in accordance with the identity of the strip being illuminated if the next successively established intensity value is greater;
   (e) repeating the steps of (a), (b), (c) and (d) until all of the stored image values are compared; and
   (f) computing the height of the attribute appearing in each region in accordance with the index value associated with each stored intensity value.

5. The method according to claim 1 wherein the step of imparting a relative motion between the substrate and the linescan camera comprises the step of displacing the substrate relative to the camera.

6. Apparatus for obtaining a three-dimensional image of a substrate comprising:

a linescan camera trained onto a substrate such that the camera has its optical axes normal to the plane of the substrate surface so that a strip of area running along the substrate surface along a first axis is within the field of view of the camera;

means for spanning the substrate along a second axis, perpendicular with the first axis, with a line of light, parallel to the first axis, to successively illuminate each of a plurality of strips of area on the substrate surface, including the strip within the field of view of the linescan camera;

processing means for synchronizing the linescan camera to the spanning means so that the camera successively captures the image of the strip of area within its field of view each time a successive one of the strips is illuminated by the spanning means, and for processing the successive images captured by the camera to establish a three-dimensional image of each attribute, if any, within the strip imaged by the camera; and means for imparting a relative motion between the linescan camera and the substrate to establish a three-dimensional image of the substrate.

7. The apparatus according to claim 6 wherein the spanning means comprises:

means for producing a beam of light;

a circular focusing element for focusing the beam of light generated by the beam-producing means into a line of light;

a reflective member for reflecting the line of light onto the substrate at an angle thereto so the line is parallel to the first axis;

a motor for rotating the reflective member to span the line of light across the substrate a predetermined distance along the second axis.

8. The apparatus according to claim 6 wherein the processing means comprises:

a synchronizing generator coupled to the spanning means and the linescan camera for supplying each with a periodic signal which causes the spanning means to span a successive one of the plurality of strips of surface area and which causes the camera to successively capture the image of the strip within its field of view;

a counter coupled to the synchronizing generator for providing a count indicative of the particular one of the strips spanned by the spanning means;

a first storage array for storing information from the linescan camera indicative of the intensity of light reflected from each of a separate one of a plurality of regions within the strip in the field of view of the camera;

a second storage array for storing information from the linescan camera indicative of the intensity of light reflected from each of separate one of a plurality of regions within the strip in the field of view of the camera;

a third storage array for storing the count of the counter; and an image processor coupled to each of the first, second and third storage arrays for processing the data stored therein to establish the vertical position of an attribute, if any, within the strip imaged by the linescan camera.

9. The apparatus according to claim 6 wherein the means for imparting a relative motion between the substrate and the linescan camera comprises a slide for displacing the substrate along the second axis.

* * * * *